United States Patent [19]

Coleman et al.

[11] Patent Number: 4,857,856

[45] Date of Patent: Aug. 15, 1989

[54] TRANSFORMER TESTING

[75] Inventors: Raymond L. Coleman, Cheshire; Peter A. Kurn, Surrey, both of England

[73] Assignee: ERA Patents Limited, England

[21] Appl. No.: 155,860

[22] Filed: Feb. 16, 1988

[30] Foreign Application Priority Data

Feb. 16, 1987 [GB] United Kingdom ............... 8703543

[51] Int. Cl.⁴ .............................................. G01R 31/06
[52] U.S. Cl. ...................... 324/547; 324/546; 324/55
[58] Field of Search ............... 324/55, 236, 545, 546, 324/547, 128 MG

[56] References Cited

FOREIGN PATENT DOCUMENTS

| | | | |
|---|---|---|---|
| 2645465 | 4/1977 | Fed. Rep. of Germany | 324/55 |
| 1815676 | 3/1980 | Fed. Rep. of Germany | 324/236 |
| 0103371 | 8/1981 | Japan | 324/55 |
| 0149832 | 1/1962 | U.S.S.R. | 324/546 |
| 0705389 | 12/1979 | U.S.S.R. | 324/546 |
| 1114988 | 6/1984 | U.S.S.R. | 324/546 |

Primary Examiner—Reinhard J. Eisenzopf
Assistant Examiner—Jose M. Solis
Attorney, Agent, or Firm—Larson and Taylor

[57] ABSTRACT

A method of testing transformers and other inductive devices comprises monitoring displacement of a conductor in a winding by injecting a high frequency alternating signal into the conductor while a supply-frequency alternating current is flowing in the conductor and subsequently observing the modulation of the high frequency signal resulting from displacement of the conductor. The high frequency signal has a frequency in the region of the resonance frequency of stray capacitances and inductances exhibited by the winding of which the conductor forms a part. Both the magnitude and the frequency response of the modulation of the high frequency signal may be monitored to determine parameters relating to the displacement of the conductor.

7 Claims, 2 Drawing Sheets

TRANSFORMER TESTING

BACKGROUND OF THE INVENTION

This invention relates to the testing of transformers, and other inductive devices such as reactors, during the course of their service life, to determine whether there is any appreciable slackening of their windings.

The winding conductors of a transformer or reactor, closely coupled to a core of magnetisable material, product an alternating magnetic field when an alternating current flows through the conductors. The interaction of the current and the field produces a force tending to move the conductors in a direction perpendicular to both the current flow path and the field. Since both the direction of current flow and the direction of the field reverse during alternate half-cycles of the alternating supply, the force on the conductors always acts in the same sense, generally tending to separate the conductors from each other and to move them away from the core.

Since the force rises to a peak and falls to zero in each supply half-cycle, it causes vibration of the conductors at twice the supply frequency. The conductors must be mechanically restrained to minimise this vibration.

One of the ageing effects which occur in transformers is shrinkage of the winding insulation. This results in relaxation of the clamping forces applied to the windings, and the windings can therefore move further under the action of the vibrating force. The effect increases progressively with time, and can eventually result in fatigue failure of the insulation and of the winding retainers.

It will be apparent that the forces generated in high-power transformers, particularly at full-load current, can be very large, and it is necessary to determine, from their to time, whether appreciable slackening of the windings has occurred, so that it can be dealt with before failure of the transformer results. However, this testing has required that the transformer be taken out of service and removed from its tank, so that physical measurements can be taken. Clearly, this is a very expensive and time-consuming operation, and the loss of use of the transformer throughout the period of testing can cause considerable problems.

It is an object of the present invention to provide an improved method and apparatus on-site testing of transformers, and other inductors, to determine whether slackening of this windings has occurred.

It is known that when a short circuit occurs in a transformer then the forces generated tend to distort the windings. The paper by W. J. McNutt et al at pp 1955–1969 of IEEE Trans. Power Apparatus and Systems vol. PAS-89, No. 8, 1970 discloses a method of testing the ability of a transformer to withstand short circuits by shorting a winding, injecting a current and analysing the behaviour of the winding by methods including the observation of distortion of the waveform of the injected short circuit current resulting from changes in the winding capacitance. Although of use in predicating the behavior of a winding under the extreme conditions of a short circuit the method described is insufficiently sensitive to be applicable to more general diagnostic purposes.

GB No. 2028504 discloses a diagnostic method in which current is injected into a winding at a frequency chosen to cause vibration and the output from an accelerometer attached to the housing surrounding the winding is monitored. This method, because it relies upon mechanical detection of vibration suffers from poor sensitivity and difficult in obtaining readily reproducible results.

According to one aspect of the invention, a method of monitoring displacement of a conductor in a transformer or inductor winding comprises causing a supply-frequency alternating current of a predetermined amplitude to flow through the conductor; injecting into the conductor a relatively high-frequency alternating signal at a frequency at or near a resonance frequency of stray capacitances and inductances exhibited by the conductor; and monitoring the magnitude or frequency response of the amplitude modulation of the relatively high-frequency signal caused by displacement of the conductor, to determine thereby parameters relating to the displacement of the conductor.

According to another aspect of the invention, apparatus for monitoring displacement of a conductor in a transformer or inductor winding comprises means to inject into the conductor a relatively high-frequency signal at a frequency at or near a resonance frequency of stray capacitances and inductances exhibited by the conductor while the conductor is subjected to a relatively low-frequency alternating current flow at a predetermined current level; and means to monitor the magnitude or frequency response of the amplitude modulation of the relatively high-frequency signal caused by displacement of the conductor to determine parameters relating to the displacement.

BRIEF DESCRIPTION OF THE SEVERAL VIEWS OF THE DRAWINGS

An embodiment of the invention will now be described, by way of example, with reference to the accompanying drawings, in which.

A multi-turn winding possesses inductance and, by virtue of the proximity of the winding turns, there are distributed capacitances associated with the inductances. If excited by a variable frequency, this inductance/capacitance combination will be seen to have an impedance which varies from inductive to capacitive with ascending frequency. At particular frequencies (the resonant frequencies of the parasitic components) the impedance will reach high values.

If the winding is vibrated by the passage of its load current, then the conductors are repeatedly separating and closing, with a resultant change in proximity and capacitance, and hence a change in the resonant frequencies.

The present invention provides a measurement technique which excites a transformer or inductor winding at a power frequency (or a lower frequency), in order to cause therein winding vibration forces corresponding to a predetermined current level, for example full load forces, and which also injects a high-frequency signal at or near a resonance frequency of the stray components. The high-frequency signal becomes amplitude modulated at 2F, twice the frequency of the excitation source due to the winding vibration. The depth of the modulation Δ will be directly proportional to the degree of winding movement present. This measurement can be made at regular intervals to assess the remanent life of the transformer, without dismantling the transformer.

Figure 1:
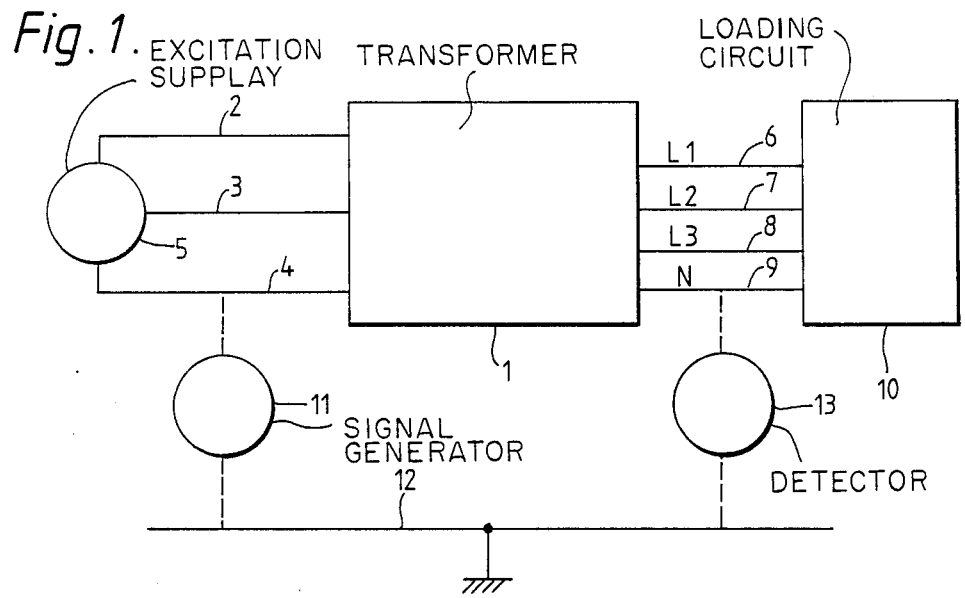
FIG. 1 is a block schematic diagram showing a transformer coupled to movement monitoring apparatus in accordance with the invention.

FIG. 1 of the drawings, shows a 3-phase transformer 1 which is undergoing test. The transformer primary windings are fed from the three phases 2,3,4 of a low-frequency excitation supply 5. The transformer secondary windings are connected via line connections 6,7,8 and a neutral connection 9 to a loading circuit 10.

Figure 3:
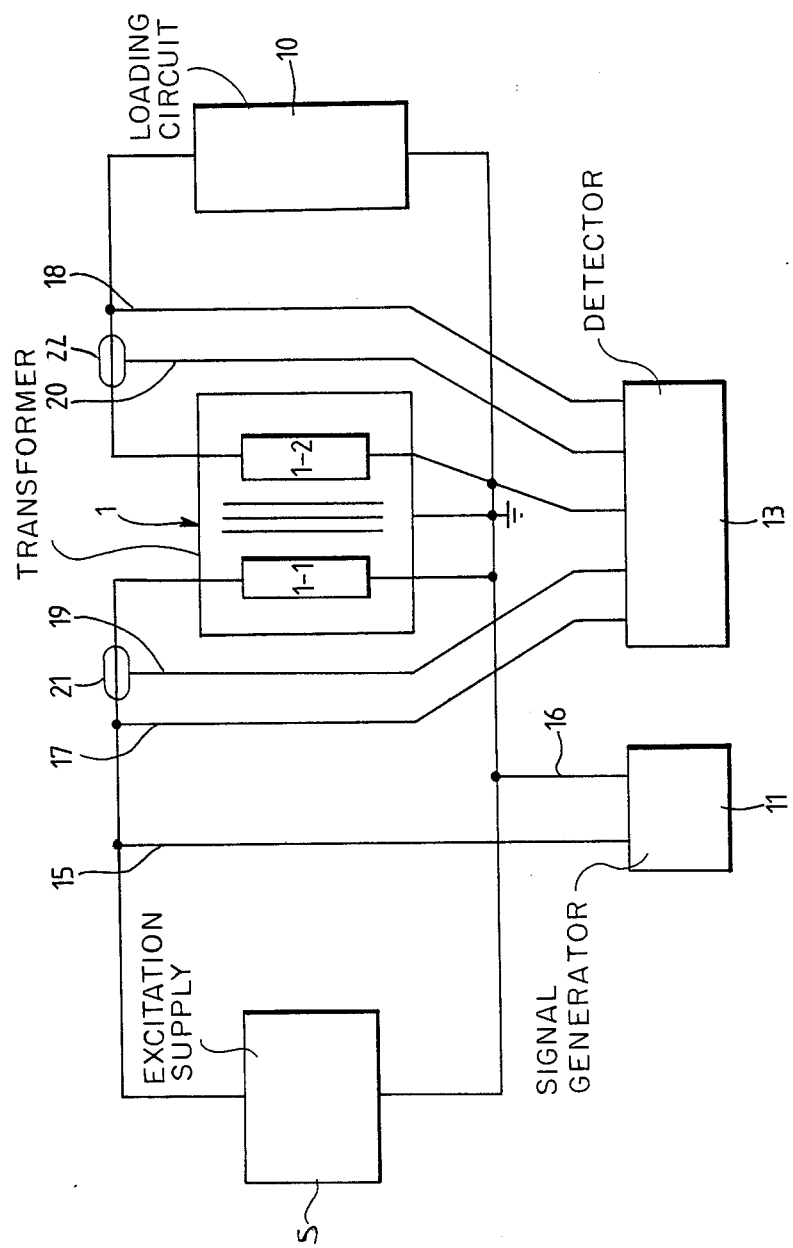

A high-frequency signal generator 11 can be connected between an earth line 12 and any of the three input phases. A high-frequency detector 13, which is preferably a cathode-ray oscilloscope, can be connected between the earth line and the output neutral line, to monitor the response of the transformer windings to the injected high-frequency signal. The detector 13 may be a dedicated signal analyzer or alternatively the high frequency generator 11 and detector 13 may form part of a single instrument. A suitable instrument for this purpose is the 3577A Network Analyser manufactured by Hewlett Packard. FIG. 3 shows the connections between the apparatus and the transformer in more detail. For clarity, the windings 1—1, 1-2 corresponding to only one phase are shown. The high frequency signal generator 11 is connected across the winding 1—1 by lines 15, 16. The signal analyser 13 is connected by lines 17, 18 on each side of the transformer 1 which detect the voltage signal. Further lines 19, 20 connect te analyzer 13 to current transducers 21, 22.

If resonance measurements were made across one of the input phases, a complex result would be obtained due to the undefined load connections, the variation in load current and the combination of one winding in parallel with two series windings. Add to this the probable presence of bushing capacity to ground and the distributed capacitance of the windings to ground, and the interpretation of the results would be a very complex operation. In order to provide comparative data throughout the life of the transformer, the variables must be controlled, i.e., the load current must be set at a known level, and the external load circuit must always be the same during testing or must be isolated.

An effective test method is provided by isolating the transformer from its normal load and feeding a test current into one primary winding at a time. In order to obtain a test current comparable to the load current level, the secondary winding on the same phase can be short-circuited, so that it is necessary to apply only a relatively low voltage to the tested primary winding to obtain a high primary current level. The low-frequency supply 5 and the loading circuit 10 are operable to provide these test conditions.

Figure 2:
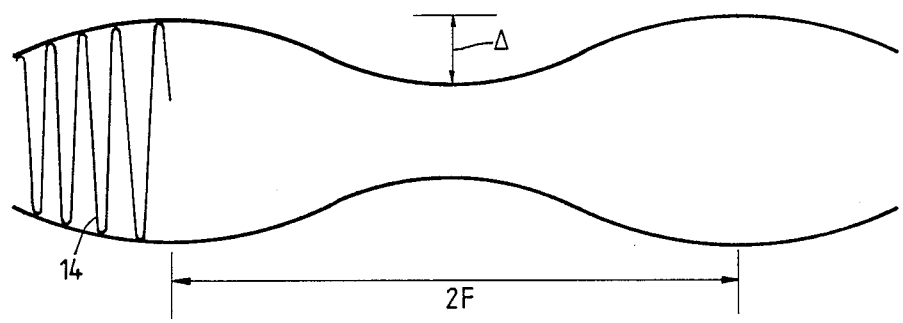
FIG. 2 illustrates amplitude modulation of a relatively high-frequency signal in the apparatus of FIG. 1, due to vibration of a winding; and, FIG. 3 is a detailed circuit diagram showing an apparatus in accordance with the present invention in use.

In carrying out the test, the generator 11 is connected to the loaded winding which is undergoing test, and the detector is connected to the output neutral line, as shown, or to one of the other transformer terminals, as required. The generator 11 is tuned to, or near, a resonance frequency of the stray components of the test winding, and the detector 13 monitors the response to that frequency. The approximate value of the resonance frequency will in general be known, and according to the nature of the transformer and the particular part of the transformer under test is typically in a range from 10 KHz to 2 MHz. As shown in FIG. 2, the monitored high-frequency signal 14 will be amplitude modulated at twice the excitation frequency, the depth of the modulation being dependent upon the amplitude of the winding movement caused by the load current. The frequeny generator may be swept over a range of frequencies in the region of the resonance frequency and the variation with frequency of the modulation observed. The value of the frequency corresponding to the peak of the resonance is used to identify the position within the transformer of the winding movement and may be used in addition to or as alternative to measurement of the amplitude of the modulation in diagnosing the condition of the winding.

If such a test is carried out when the transformer is new, the modulation depth will be quite small. During the period of service of the transfomer, the secondary windings are from time to time disconnected from the normal load and the transformer is connected to the test gear, without any dismantling of the transformer. If the windings slacken, the modulation depth will increase, and from a knowledge of how large an increase in modulation depth is permissible for a particular transformer design, forewarning can be obtained that a transformer under test should be taken out of service.

The generator 11 preferably presents a high impedance at high frequencies, to give isolation from the resonance detector 13. Alternatively, the generator 11 may have a known stable characteristic over the resonance frequency band which may be compensated for in the measurement calculations.

By interchanging the excitation supply 5 and the loading circuit 10, so that load current passes through a secondary winding, and injecting the high-frequency signal into that winding, movement of the secondary windings can be monitored.

Although FIG. 1 shows the test applied to a 3-phase delta/star transformer, the same principle may be applied to any other transformer configuration, and may also be used in testing inductors, such as saturable reactors.

We claim:

1. A method of monitoring displacement of a conductor in a winding said winding having stray capacitances and industances, and said method comprising generating a supply-frequency alternating current of a predetermined amplitude in said conductor; injecting into said conductor a high-frequency alternating signal substantially at a resonance frequency of said stray capacitances and inductances; and monitoring at least one of magnitude and frequency response of amplitude modulation of said high-frequency signal carried by said conductor and resulting from displacement of said conductor in said winding, to determine thereby the parameters relating to displacement of said conductor in said winding.

2. A method according to claim 1, in which said conductor forms part of a transformer having a plurality of primary winding inputs and said high frequency current is injected into one only of said plurality of primary winding inputs.

3. A method according to claim 2 in which a corresponding secondary winding of said transformer is short circuited while current is injected into the said one input.

4. A method according to claim 2, in which said transformer includes a neutral output line and said one input corresponds to one phase of said supply frequency alternating current and said at least one of magnitude and frequency response of said amplitude modulation of said high-frequency signal is monitored by connecting a high frequency detector to said neutral output line.

5. An apparatus for motoring displacement of a conductor in a winding subjected to a low-frequency alternating current flow at a predetermined current level, said winding having stray capacitances and inductances comprising a high frequency signal generator, said signal generator being operatively coupled to said conductor, to inject into said conductor a high-frequency signal substantially at a resonance frequency of said stray capacitances and inductances exhibited by said winding, and signal analyser means operatively coupled to said conductor for monitoring amplitude modulation of the said high-frequency signal carried by said conductor and resulting from displacement of said conductor in said winding, so as to determine thereby parameters relating to said displacement.

6. An apparatus according to claim 5, in which said conductor forms part of a transformer and said high-frequency signal generator is operatively coupled to an input of said transformer and said signal analyser means comprises a high-frequency signal detector operatively coupled to a corresponding output of said transformer.

7. An apparatus according to claim 6, in which said high-frequency signal generator has a high impedance.

* * * * *